United States Patent
Van Der Schaar et al.

(10) Patent No.: US 7,486,408 B2
(45) Date of Patent: Feb. 3, 2009

(54) LITHOGRAPHIC APPARATUS AND DEVICE MANUFACTURING METHOD WITH REDUCED SCRIBE LANE USAGE FOR SUBSTRATE MEASUREMENT

(75) Inventors: Maurits Van Der Schaar, Veldhoven (NL); Arie Jeffrey Den Boef, Waalre (NL); Richard Johannes Franciscus Van Haren, Waalre (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 257 days.

(21) Appl. No.: 11/384,836

(22) Filed: Mar. 21, 2006

(65) Prior Publication Data

US 2007/0222960 A1    Sep. 27, 2007

(51) Int. Cl.
 *G01B 11/30* (2006.01)
(52) U.S. Cl. .................................................. 356/612
(58) Field of Classification Search .................. 356/612
See application file for complete search history.

(56) References Cited

U.S. PATENT DOCUMENTS

| | | | |
|---|---|---|---|
| 5,703,692 A | 12/1997 | McNeil et al. | 356/445 |
| 5,880,838 A | 3/1999 | Marx et al. | 356/351 |
| 5,963,329 A | 10/1999 | Conrad et al. | 356/372 |
| 6,608,690 B2 | 8/2003 | Niu et al. | 356/635 |
| 6,699,624 B2 | 3/2004 | Niu et al. | 430/5 |
| 6,704,661 B1 | 3/2004 | Opsal et al. | 702/27 |
| 6,721,691 B2 | 4/2004 | Bao et al. | 702/189 |
| 6,738,138 B2 | 5/2004 | Wei | 356/369 |
| 6,753,961 B1 | 6/2004 | Norton et al. | 356/364 |
| 6,768,983 B1 | 7/2004 | Jakatdar et al. | 706/46 |
| 6,772,084 B2 | 8/2004 | Bischoff et al. | 702/127 |
| 6,785,638 B2 | 8/2004 | Niu et al. | 702/189 |
| 6,813,034 B2 | 11/2004 | Rosencwaig et al. | 356/601 |
| 6,819,426 B2 | 11/2004 | Sezginer et al. | 356/401 |
| 6,856,408 B2 | 2/2005 | Raymond | 356/601 |
| 6,919,964 B2 | 7/2005 | Chu | 356/601 |
| 6,928,628 B2 | 8/2005 | Seligson et al. | 716/4 |
| 6,972,852 B2 | 12/2005 | Opsal et al. | 356/625 |
| 6,974,962 B2 | 12/2005 | Brill et al. | 250/548 |
| 6,987,572 B2 | 1/2006 | Lakkapragada et al. | 356/601 |
| 7,046,376 B2 | 5/2006 | Sezginer | 356/601 |
| 7,061,615 B1 | 6/2006 | Lowe-Webb | 356/401 |
| 7,061,623 B2 | 6/2006 | Davidson | 356/497 |
| 7,061,627 B2 | 6/2006 | Opsal et al. | 356/601 |

(Continued)

OTHER PUBLICATIONS

Van der Schaar et al., "Lithographic Apparatus and Device Manufacturing Method with Reduced Scribe Lane Usage for Substrate Measurement", U.S. Appl. No. 12/141,640, filed Jun. 18, 2008.

*Primary Examiner*—Roy M Punnoose
(74) *Attorney, Agent, or Firm*—Sterne, Kessler, Goldstein & Fox P.L.L.C.

(57) ABSTRACT

In a device manufacturing method and lithographic apparatus wherein a pattern is transferred from a patterning device onto a substrate, a measurement target is provided on the substrate in a process enabling execution of a substrate measurement using radiation of a first wavelength. Subsequently the measurement target is transformed in a grid of conducting material, the grid having grid openings which are smaller than the first wavelength. The space in the scribe lane where the measurement target was, is now shielded and may be used again in further layers or processing steps of the substrate.

11 Claims, 4 Drawing Sheets

U.S. PATENT DOCUMENTS

| | | | |
|---|---|---|---|
| 7,068,363 B2 | 6/2006 | Bevis et al. | 356/237.5 |
| 2004/0119970 A1 | 6/2004 | Dusa et al. | 356/237.1 |
| 2006/0033921 A1 | 2/2006 | Den Boef et al. | 356/446 |
| 2006/0066855 A1 | 3/2006 | Boef et al. | |
| 2006/0126074 A1 | 6/2006 | Van der Werf et al. | 356/489 |
| 2006/0139592 A1 | 6/2006 | Den Boef et al. | 355/53 |
| 2006/0151890 A1* | 7/2006 | Smith et al. | 257/797 |

* cited by examiner

LITHOGRAPHIC APPARATUS AND DEVICE MANUFACTURING METHOD WITH REDUCED SCRIBE LANE USAGE FOR SUBSTRATE MEASUREMENT

FIELD OF THE INVENTION

The present invention relates to a lithographic apparatus and a method for manufacturing a device in which measurements are performed for various purposes, such as overlay, critical dimension (CD) and alignment. For the measurements, targets are being used on the substrate, and measurements are executed using radiation of a predefined wavelength (range) and a suitable detector.

DESCRIPTION OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In a manufacturing process using a lithographic projection apparatus, a pattern (e.g. in a mask) is imaged onto a substrate that is at least partially covered by a layer of radiation-sensitive material (resist) by the changes of either optical properties or surface physical properties of the resist. Alternatively, the imaging may use a resistless process such as etched grating or nano-imprint technology. Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

The measurement and inspection after development of the resist (or substrate surface in the case of etching), referred to as in-line because it is carried out in the normal course of processing production substrates, is used, for example, to measure overlay between two sequential processes in the lithography apparatus using measurement targets in the scribe lanes between the devices. Several methods may be used and may include measurement of overlay subsequently in two (perpendicular) directions on the substrate surface, or direct measurement using a complex two dimensional measurement target.

In each process, in general a different piece of scribe lane space is used for the measurement, in order to exclude any possible error due to interference with measurement targets from measurements in previous processes.

SUMMARY OF THE INVENTION

It is desirable to provide an overlay measurement method for a lithographic apparatus in which the measurements require less "real estate" on the substrate.

According to an embodiment of the invention, there is provided a lithographic apparatus arranged to transfer a pattern from a patterning device onto a substrate, wherein the lithographic apparatus is configured to provide a measurement target on the wafer enabling a substrate measurement for a specific process using a first wavelength, and to transform the measurement target in a grid of conducting material, the grid having grid openings which are smaller than the first wavelength.

According to an embodiment of the invention, there is provided a device manufacturing method including transferring a pattern from a patterning device onto a substrate, wherein the method includes providing a measurement target on the substrate in a process enabling execution of a substrate measurement using radiation of a first wavelength, and transforming the measurement target in a grid of conducting material, the grid having grid openings which are smaller than the first wavelength.

According to another embodiment of the invention, there is provided a device manufactured according to an embodiment of the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
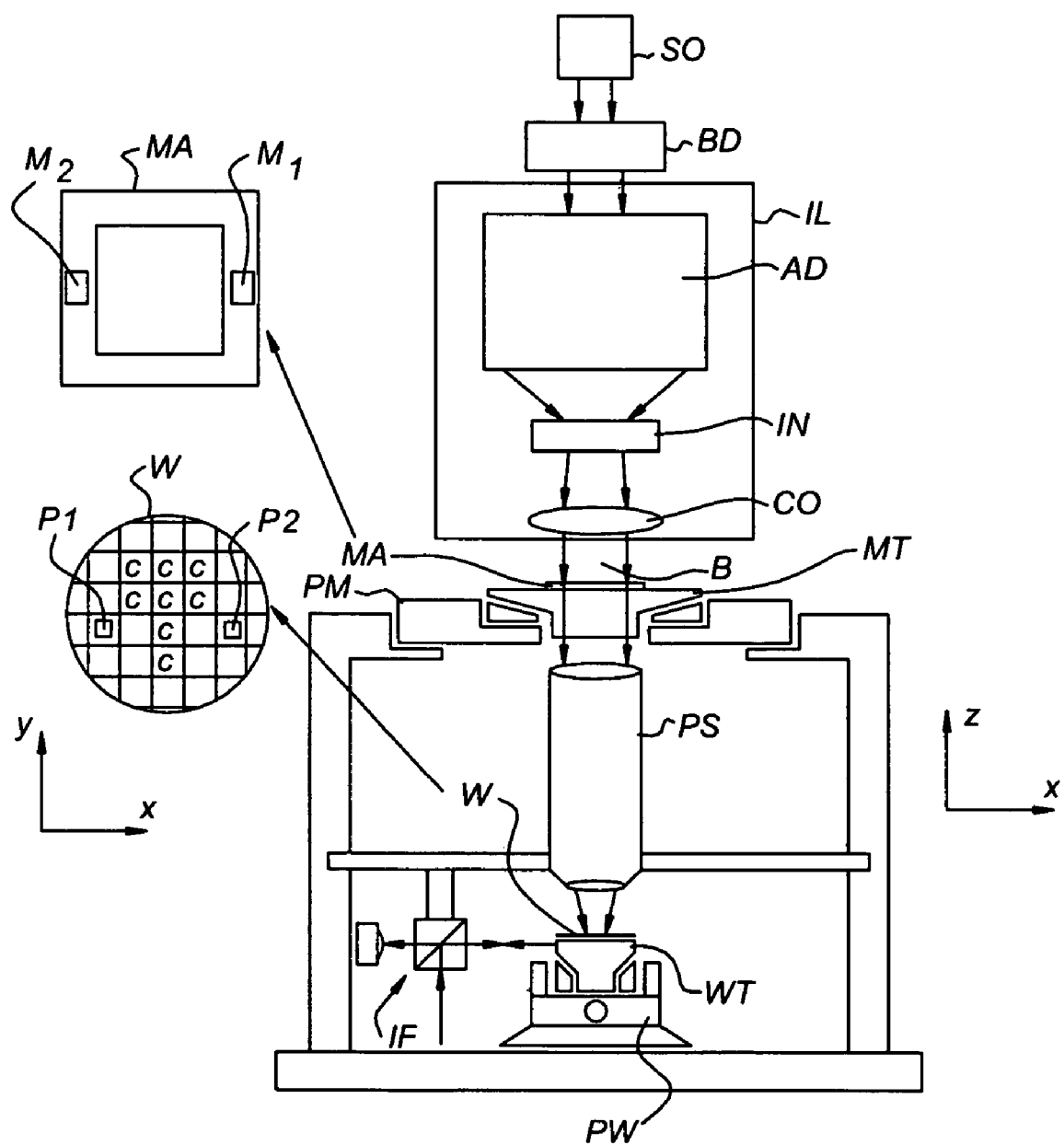
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or DUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.
2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
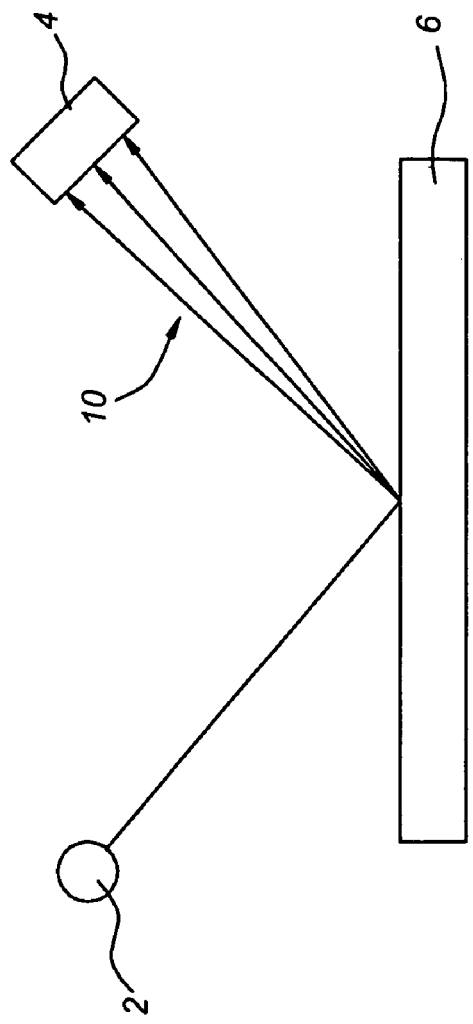
FIG. 2 depicts a simplified schematic view of a scatterometry arrangement which may be used to measure asymmetry according to an embodiment of the present invention.

One or more properties of the surface of a substrate 6 may be determined using a scatterometer arrangement such as that depicted in FIG. 2. The scatterometer may includes a broadband (white light) radiation source 2, which directs radiation onto a substrate 6. An extended broadband radiation source may be configured to provide the radiation beam with a wavelength of at least 50 nm to the substrate surface. The reflected radiation is passed to a spectrometer detector 4, which measures a spectrum 10 (intensity as a function of wavelength) of the specular reflected radiation.

The scatterometer may be a normal-incidence scatterometer or an oblique incidence scatterometer. Variants of scatterometry may also be used in which the reflection is measured at a range of angles of a single wavelength, rather than the reflection at a single angle of a range of wavelengths.

Figure 3:
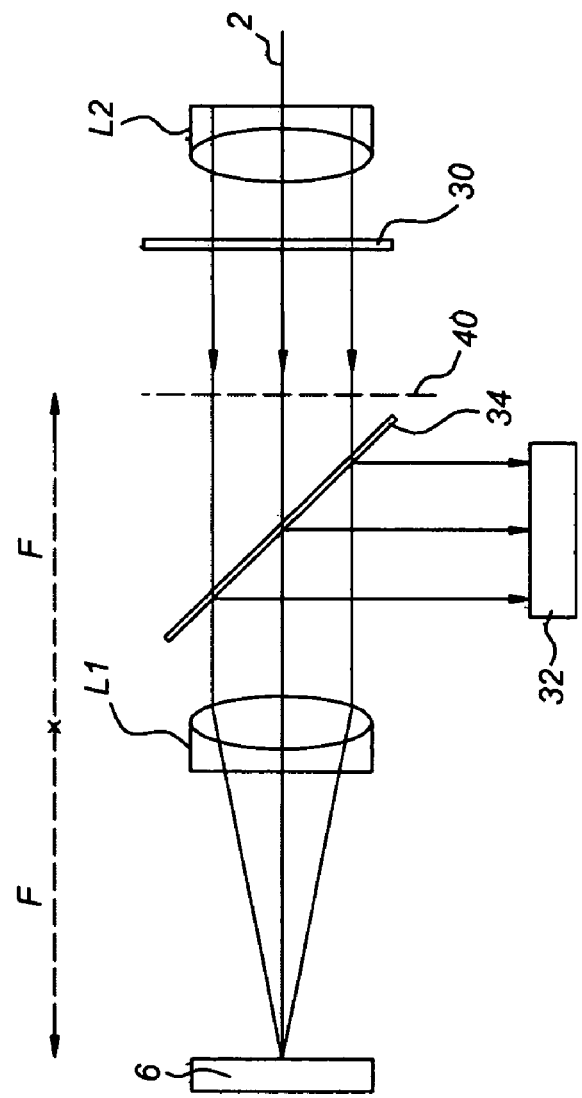
FIG. 3 depicts a schematic view of a scatterometry arrangement which may be used in a lithographic apparatus according to an embodiment of the present invention.

In one or more embodiments described below, there is used a scatterometer configured to measure a property of a substrate 6 by measuring, in a pupil plane 40 of a high NA lens, a property of an angle-resolved spectrum reflected from the substrate surface 6 at a plurality of angles and wavelengths as shown in FIG. 3. The scatterometer includes a radiation source 2 configured to project radiation onto the substrate and a detector 32 configured to detect the reflected spectra. The pupil plane is the plane in which the radial position of radiation defines the angle of incidence and the angular position defines the azimuth angle of the radiation and any substantially conjugate plane. The detector 32 is placed in the pupil plane of the high NA lens. The NA is high and, in an embodiment, at least 0.9 or at least 0.95. Immersion scatterometers may even have lenses with an NA over 1.

Previous angle-resolved scatterometers have only measured the intensity of scattered light. An embodiment of the present invention allows several wavelengths to be measured simultaneously at a range of angles. The properties measured by the scatterometer for different wavelengths and angles may include the intensity of transverse magnetic (TM) and transverse electric (TE) polarized light and the phase difference between the TM and TE polarized light.

The light source 2 is focused using lens system L2 through interference filter 30 and is focused onto substrate 6 via a microscope objective lens L1. The radiation is then reflected via partially reflective surface 34 into a CCD detector 32 in the back projected pupil plane 40 in order to have the scatter spectrum detected. The pupil plane 40 is at the focal length of the lens system L1. A detector and high NA lens are placed at the pupil plane. The pupil plane may be re-imaged with auxiliary optics since the pupil plane of a high NA lens is usually located inside the lens.

The pupil plane of the reflector light is imaged on the CCD detector 32 with an integration time of, for example, 40 milliseconds per frame. In this way, a two-dimensional angular scatter spectrum of the substrate target 6 is imaged on the detector 32. The detector 32 may be, for example, an array of CCD detectors or CMOS detectors. The processing of the spectrum gives a symmetrical detection configuration and so sensors can be made rotationally symmetrical. This allows the use of a compact substrate table because a target on the substrate 6 can be measured at any rotational orientation relative to the sensor. All the targets on the substrate 6 can be measured by a combination of a translation and a rotation of the substrate 6.

A set of interference filters 30 may be available to select a wavelength of interest in the range of, say, 405-790 nm or even lower, such as 200-300 nm. The interference filter may be tunable rather than including a set of different filters. A grating could be used instead of one or more interference filters.

The substrate 6 (or even the reflective surface 34) may be a grating. The grating may be printed such that after development, a series of bars are formed of solid resist lines. The bars may alternatively be etched into the substrate. This pattern is sensitive to comatic aberrations in a lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. One or more parameters of the grating, such as line widths and shapes, may be input to the reconstruction process from knowledge of the printing step and/or other scatterometry processes.

The scatterometer may be used to detect the spectrum and create a symmetrical pupil plane image from which the discontinuities can be measured and one or more grating properties therefore calculated.

The scatterometer may be adapted to measure the overlay of two misaligned periodic structures by measuring asymmetry in the reflected spectrum, the asymmetry being related to the extent of the overlay. The scatterometer may be adapted to measure the overlay of two misaligned gratings or periodic structures by measuring asymmetry in the reflected spectrum and/or the detection configuration, the asymmetry being related to the extent of the overlay. Due to the symmetrical detection configuration, any asymmetry is clearly distinguishable. This provides a straightforward way to measure misalignment in the gratings.

Figure 4:
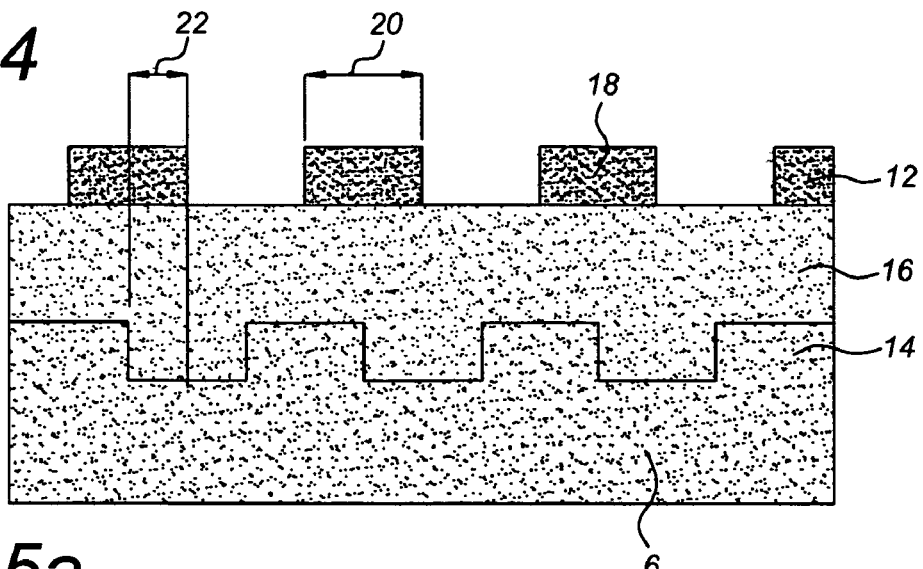
FIG. 4 depicts a sectional view of a reference grating and a measurement grating in a substrate applied in a method embodiment of the present invention.

One type of substrate pattern used is shown in FIG. 4. A reference grating 14 has a measurement grating 12 printed on top of it (or on top of a dielectric layer 16 which is made on top of the grating 14). The amount by which the measurement grating 12 is offset with respect to the reference grating 14 is known as the overlay 22, as indicated in FIG. 4.

Note that the radiation source 2 may illuminate the object symmetrically with respect to the surface normal and the scatterometry detector measures scatter radiation from several angles, although a source 2 which illuminates the object from an oblique angle is also possible.

Overlay metrology is based on the measurement of an asymmetry in the angular scatter spectrum. Symmetric structures yield symmetric angular spectra and an asymmetry in the target shows up as an asymmetry in the angular scatter spectrum. This property is the basis of overlay metrology using angle-resolved scatterometry.

Two overlapping but misaligned gratings (measurement grating 12 and reference grating 14) made of bars (or line elements) 18 with a width 20 (see FIG. 4) form one composite asymmetric target. The resulting asymmetry in the angular scatter spectrum is detected with the angle-resolved scatterometer 4 shown in FIG. 3 and used to derive the overlay 22.

Figure 5A:
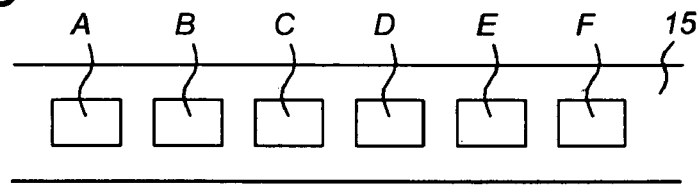
FIG. 5 depicts a top view of a scribe lane used for substrate measurements in (a) a sequential manner and (b) according to an embodiment of the present invention.

In known production methods for devices using a lithographic apparatus, the targets for various measurements, especially the overlay measurement gratings 12 as described above, are positioned on different positions in the scribe lane spaces 15 of a substrate 6, i.e. between the parts of the substrate 6 wherein the devices are formed by various processes. Each target 12 for a specific measurement is located in another position than the target used in an earlier measurement, e.g. in a cascade form as shown in FIG. 5a with positions A-F. This requires a lot of real estate in the scribe lane 15, as for producing a device, as many as fifteen or even twenty layers need to be processed, and consequently, fifteen or even twenty positions A-F are needed.

Figure 5B:
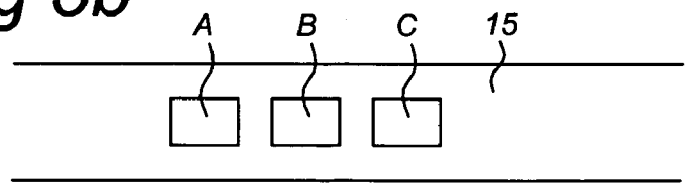
Figure 6:
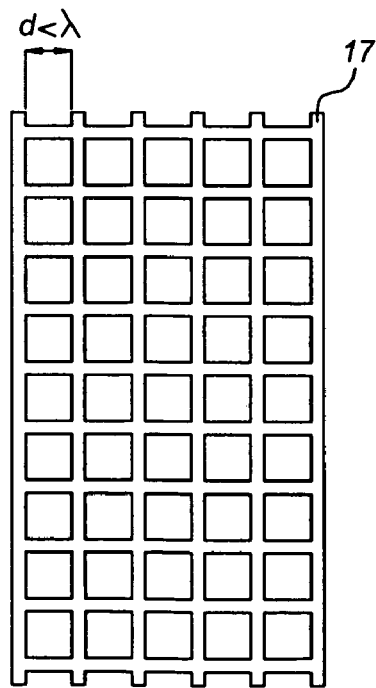
FIG. 6 depicts a top view of a grid applied to obscure a measurement target of an earlier measurement.

According to an embodiment of the present invention, only a limited number of positions A-C of targets is necessary, as shown schematically in FIG. 5b. This is made possible by obscuring earlier measurement targets using a grid 17 of conducting material, having grid openings smaller than the measurement radiation wavelength. The term wavelength as used in this description refers to the effective wavelength in the medium where the grid 17 is located, e.g. in a water layer as explained above referring to immersion lithography, which may be different from a free space wavelength. An embodiment is shown schematically in FIG. 6, and includes a grid 17 of lines of conducting material, wherein the distance d between the lines is smaller than the measurement radiation wavelength $\lambda$. The distance d between the lines is e.g. in the order of magnitude of 500 nm, using lines (or wires) with a width of e.g. 100-200 nm.

In this manner, a kind of Faraday shield is formed, which obscures earlier measurement targets for the measurement radiation wavelength $\lambda$, thus allowing re-use of the specific location for later measurements. In one embodiment, the conducting material is a metal, which would allow all processes using a metal deposition or the like to form a grid on the measurement location, e.g. backend processes in which vias are produced on the substrate 6, metal conductors, or bonding pads, or in processes wherein metallic gates are produced. The present invention is also applicable for processes in which doped semiconductor material layers are formed, as these also allow to produce the conducting grid 17 according to the present invention.

The grid 17 may also have another appearance, e.g. a rectangular field covering the earlier measurement target, provided with circular openings with a diameter smaller than the measurement radiation wavelength $\lambda$.

Figure 7:
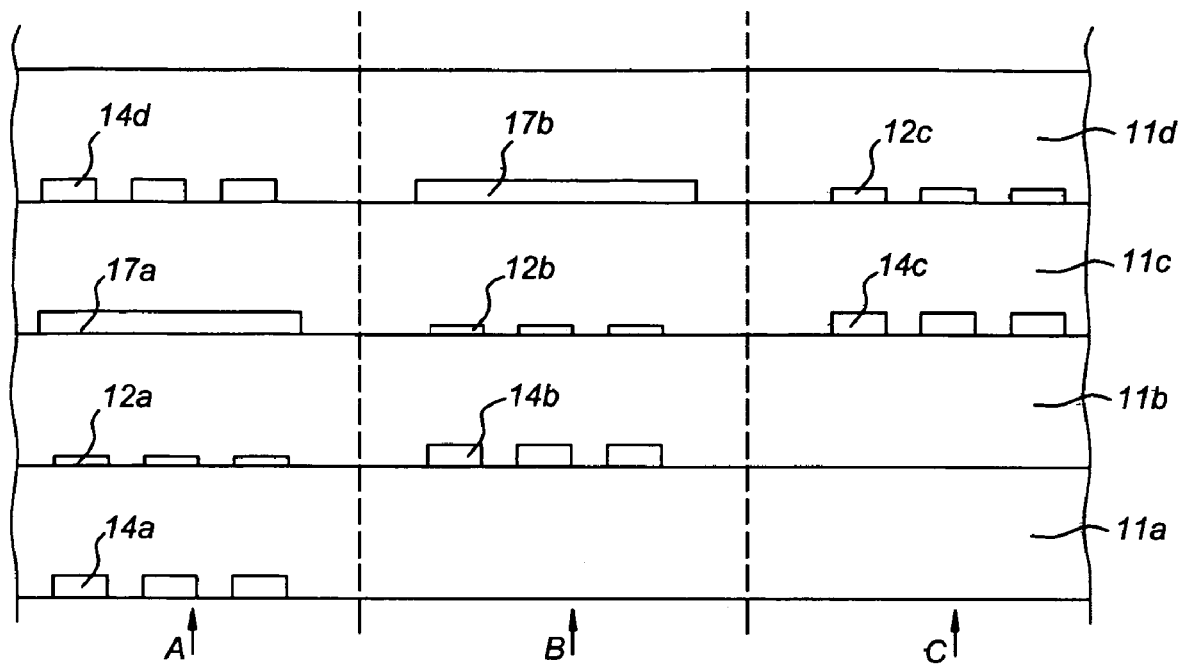
FIG. 7 depicts a cross sectional view of a substrate in which the present invention is applied.

In an embodiment of the present invention, only three positions are needed for measurement targets. This is clarified with reference to the sectional view of a part of a substrate 6 as shown in FIG. 7. In a first layer 11a, a reference grating 14a is made on a first position A using known processes, and after finishing this first layer 11a, a measurement grating 12a can be printed on top of the reference grating 14a and measurements executed for a second layer 11b (e.g. overlay measurements). After finishing measurements in the second layer 11b, this second layer 11b may be processed, wherein a reference grating 14b for measurements associated with a third layer 11c is produced on a second position B in the scribe lane space. Again, a measurement grating 12b is printed on top of the reference grating 14b, and measurements are carried out. Next, the third layer 11c is processed, by forming a next reference grating 14c on third position C, but also, a grid 17a is formed on position A, thus shielding the underlying measurement grating 12a and reference grating 14a. Measurement grating 12c may be printed on top of reference grating 14c, and measurements may be executed associated with a fourth layer 11d.

Now however, as a result of the grid 17a in the third layer 11c, a further reference grating 14d may be formed in the fourth layer 11d on position A. Also, a grid 17b is formed on second position B, in order to obscure the underlying measurement grating 12b and reference grating 14b. This may be repeated for each next layer, and only three positions A-C are necessary for the measurement targets 12, 14.

As mentioned above, the various embodiments may be used in association with overlay measurement targets, which each require a reference grating 14 in a substrate layer and a measurement grating 12 printed on top of the reference grating 14. The various embodiments may also be used in association with other types of measurements, which may even use other types of measurement targets, such as critical dimension (CD) measurements or alignment measurements. For example, in the case of alignment measurements, alignment marks are being used in a single layer. These alignment marks may be obscured using a grid 17 according to the present invention in a layer above the (undeveloped) alignment mark.

The grid 17 according to any one embodiment described above is applied in the scribe lane space 15 of the substrate 6. In a finished substrate 6 or wafer, and even in the edge area of finished dies, this grid 17 is still present and visible. Thus the use of the present method is also visible in a device manufactured according to embodiments of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to transfer a pattern from a patterning device onto a substrate, wherein the lithographic apparatus is configured to:
    provide a measurement target on the substrate to enable a substrate measurement for a specific process using a wavelength; and
    dispose a grid of conducting material over the measurement target, wherein the grid has grid openings which are smaller than the wavelength.

2. The lithographic apparatus of claim 1, wherein the conducting material is a metal.

3. The lithographic apparatus of claim 1, wherein the conducting material is a doped semiconductor material.

4. The lithographic apparatus of claim 1, wherein the grid of conducting material is disposed over the measurement target during a further processing of the substrate.

5. The lithographic apparatus of claim 1, wherein the substrate measurement comprises an overlay measurement, critical dimension measurement, or alignment measurement.

6. A device manufacturing method comprising transferring a pattern from a patterning device onto a substrate, the method comprising:
    providing a measurement target on the substrate to enable execution of a substrate measurement using radiation of a wavelength; and
    disposing a grid of conducting material over the measurement target, wherein the grid has grid openings which are smaller than the wavelength.

7. The device manufacturing method according to claim 6, wherein the conducting material is a metal.

8. The device manufacturing method according to claim 6, wherein the conducting material is a doped semiconductor material.

9. The device manufacturing method according to claim 6, wherein the disposing is executed during a further processing of the substrate.

10. The device manufacturing method according to claim 6, wherein the substrate measurement comprises an overlay measurement, critical dimension measurement, or alignment measurement.

11. A device manufactured according to a method, the method comprising:
    providing a measurement target on the substrate to enable execution of a substrate measurement using radiation of a wavelength; and
    disposing a grid of conducting material over the measurement target, wherein the grid has grid openings which are smaller than the wavelength.

* * * * *